(12) United States Patent
Arakawa et al.

(10) Patent No.: US 8,253,302 B2
(45) Date of Patent: Aug. 28, 2012

(54) SURFACE ACOUSTIC WAVE ELEMENT, METHOD OF PRODUCING THE SAME, AND METHOD OF CHANGING RESONATION FREQUENCY OF THE SAME

(75) Inventors: Kazuki Arakawa, Nisshin (JP); Kazuhiko Kano, Toyoake (JP); Shingo Jinno, Nisshin (JP)

(73) Assignee: DENSO CORPORATION, Kariya (JP)

( * ) Notice: Subject to any disclaimer, the term of this patent is extended or adjusted under 35 U.S.C. 154(b) by 276 days.

(21) Appl. No.: 12/656,523

(22) Filed: Feb. 2, 2010

(65) Prior Publication Data

US 2010/0201458 A1 Aug. 12, 2010

(30) Foreign Application Priority Data

Feb. 10, 2009 (JP) ................. 2009-028187

(51) Int. Cl.
*H01L 41/08* (2006.01)
*H03H 9/25* (2006.01)
(52) U.S. Cl. .................... 310/313 D; 333/195
(58) Field of Classification Search ............. 310/313 A, 310/313 B, 313 R, 313 D, 366, 365; 333/193–196; H03H 9/25

See application file for complete search history.

(56) References Cited

U.S. PATENT DOCUMENTS

| | | | | |
|---|---|---|---|---|
| 4,340,834 A | * | 7/1982 | Sato | 310/313 D |
| 4,623,855 A | * | 11/1986 | Bulst | 310/313 D |
| 5,621,364 A | * | 4/1997 | Ruile et al. | 310/313 D |
| 6,278,219 B1 | | 8/2001 | Kaneda et al. | |
| 7,012,480 B2 | * | 3/2006 | Nakamura et al. | 333/193 |
| 7,283,021 B2 | | 10/2007 | Oshio | |
| 8,049,583 B2 | * | 11/2011 | Ohkubo et al. | 310/313 D |
| 2009/0224854 A1 | | 9/2009 | Ohkubo et al. | |

FOREIGN PATENT DOCUMENTS

| | | |
|---|---|---|
| JP | A-59-207719 | 11/1984 |
| JP | A-61-092011 | 5/1986 |
| JP | A-62-274081 | 11/1987 |
| JP | A-06-224678 | 8/1994 |
| JP | A-7-336187 | 12/1995 |
| JP | A-2000-165184 | 6/2000 |
| JP | A-2000-201041 | 7/2000 |
| JP | A-2000-341073 | 12/2000 |
| JP | A-2001-332954 | 11/2001 |
| JP | A-2005-065042 | 3/2005 |
| JP | A-2005-348070 | 12/2005 |
| JP | A-2009-218812 | 9/2009 |

OTHER PUBLICATIONS

Office Action mailed Mar. 1, 2011 in corresponding JP Application No. 2009-028187 (and English Translation).
Office Action mailed Dec. 7, 2010 in corresponding JP application No. 2009-028187 (English translation enclosed).
Office Action mailed on Mar. 1, 2011 issued in the corresponding Japanese Patent Application No. 2009-028187 (English translation enclosed).

* cited by examiner

*Primary Examiner* — Thomas Dougherty
*Assistant Examiner* — Karen B Addison
(74) *Attorney, Agent, or Firm* — Posz Law Group, PLC

(57) ABSTRACT

A surface acoustic wave element includes a piezoelectric member, a comb-teeth electrode, and a reflector. The comb-teeth electrode is arranged on the piezoelectric member. The reflector is arranged on the piezoelectric member. The reflector reflects a surface acoustic wave transmitted from the comb-teeth electrode. The reflector has a plurality of areas, and each of the areas has a frequency to make a reflection efficiency the largest. At least two of the frequencies of the areas are made different from each other.

5 Claims, 10 Drawing Sheets

SURFACE ACOUSTIC WAVE ELEMENT, METHOD OF PRODUCING THE SAME, AND METHOD OF CHANGING RESONATION FREQUENCY OF THE SAME

CROSS REFERENCE TO RELATED APPLICATION

This application is based on Japanese Patent Application No. 2009-28187 filed on Feb. 10, 2009, the disclosure of which is incorporated herein by reference in its entirety.

BACKGROUND OF THE INVENTION

1. Field of the Invention

The present invention relates to a surface acoustic wave element, a method of producing the surface acoustic wave element, and a method of changing a resonation frequency of the surface acoustic wave element.

2. Description of Related Art

A surface acoustic wave element has a comb-teeth electrode and a reflector, which are arranged on a piezoelectric member. The comb-teeth electrode and the reflector are formed to have a predetermined electrode pattern by using a photo etching. After an aluminum membrane is formed on the piezoelectric member by sputtering, the photo etching is performed. The photo etching is defined by an etching process using a photolithography. An electrode interval of the comb-teeth electrode and the reflector has a predetermined relationship with a resonation frequency. Therefore, the electrode interval is set to have a target resonation frequency.

JP-A-H06-224678 or JP-A-2005-65042 discloses a method of changing a resonation frequency of a surface acoustic wave element so as to make the element to have a target value. In JP-A-H06-224678, an electrode pattern is formed, and a dry etching is performed to a substrate using an electrode as a mask. While the dry etching is performed, the resonation frequency is measured. Thus, the resonation frequency can be changed by increasing a virtual thickness of the electrode. In JP-A-2005-65042, an electrode pattern is formed, and a side face of a comb-teeth electrode is anodized. Thus, the resonation frequency can be changed by increasing a weight and a width of the comb-teeth electrode.

However, because the comb-teeth electrode and the reflector are formed by using the photo etching, minute adjustment of the electrode interval cannot be performed with an accuracy higher than that of the photolithography. Therefore, if the target resonation frequency is set by changing the electrode intervals uniformly, a changing unit of the resonation frequency is limited.

For example, in a case that one-to-one exposure is performed, the minimum value of the electrode interval controllable by the photolithography is equal to a resolution of a reticle. In a case that LiNbO$_3$ substrate is used, when the reticle resolution is about 0.1 μm, the resonation frequency can be changed only by a unit of 2 MHz. However, the resonation frequency is required to be changed in more minute units.

The resonation frequency is set after forming the electrode pattern; in JP-A-H06-224678 or JP-A-2005-65042. That is, the required resonation frequency cannot be set at a design step of the electrode pattern.

The controlling method of the resonation frequency disclosed in JP-A-H06-224678 or JP-A-2005-65042 has both of advantages and disadvantages. The controlling method is required to have a variety of choices. If the controlling method can be selected among the choices based on the purpose, the resonation frequency can be easily and accurately changed.

SUMMARY OF THE INVENTION

In view of the foregoing and other problems, it is an object of the present invention to provide a surface acoustic wave element, a method of producing the surface acoustic wave element, and a method of changing a resonation frequency of the surface acoustic wave element.

According to a first example of the present invention, a surface acoustic wave element includes a piezoelectric member, a comb-teeth electrode arranged on the piezoelectric member, and a reflector arranged on the piezoelectric member. The reflector reflects a surface acoustic wave transmitted from the comb-teeth electrode. The reflector has a plurality of areas, and each of the areas has a frequency to have the largest reflection efficiency. At least two of the frequencies are different from each other.

Accordingly, a resonation frequency can be set in a minute unit.

According to a second example of the present invention, a method of producing a surface acoustic wave element includes a forming of a comb-teeth electrode on a piezoelectric substrate, and a forming of a reflector on the piezoelectric substrate. All electrodes of the reflector are connected with each other by a connector. The producing method includes a cutting of the electrodes of the reflector so as to separate the reflector into an open area and a short area. The electrodes are not shorted with each other in the open area, and the electrodes are shorted with each other in the short area.

Accordingly, a resonation frequency can be easily set in a minute unit.

According to a third example of the present invention, a method of producing a surface acoustic wave element includes a forming of a comb-teeth electrode having a plurality of comb-teeth parts on a piezoelectric substrate. The producing method includes a forming of a reflector having a plurality of areas on the piezoelectric substrate. Electrodes of the reflector are arranged in a direction of transmitting a surface acoustic wave from the comb-teeth electrode. An interval of the electrodes is different between at least two of the areas. The producing method includes a changing of an electrically-conducted length of the comb-teeth part so as to correspond to the areas of the reflector.

Accordingly, a resonation frequency can be easily set in a minute unit.

According to a fourth example of the present invention, a method of controlling a resonation frequency of a surface acoustic wave element includes a forming of a comb-teeth electrode on a piezoelectric substrate, and a forming of a reflector having an open area and a short area on the piezoelectric substrate. Electrodes of the reflector are arranged in a direction of transmitting a surface acoustic wave from the comb-teeth electrode. The electrodes are not shorted with each other in the open area, and the electrodes are shorted with each other in the short area. The controlling method further includes a changing of a ratio of the open area to the short area.

Accordingly, a resonation frequency can be easily set in a minute unit.

According to a fifth example of the present invention, a method of controlling a resonation frequency of a surface acoustic wave element includes a forming of a comb-teeth electrode having a plurality of comb-teeth parts on a piezoelectric substrate. The controlling method includes a forming of a reflector having a plurality of areas on the piezoelectric substrate. Electrodes of the reflector are arranged in a direction of transmitting a surface acoustic wave from the comb-teeth electrode. An interval of the electrodes is different between at least two of the areas. The controlling method includes a changing of an electrically-conducted length of the comb-teeth part so as to correspond to the areas of the reflector.

Accordingly, a resonation frequency can be easily set in a minute unit.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENT

First Embodiment

Figure 1:
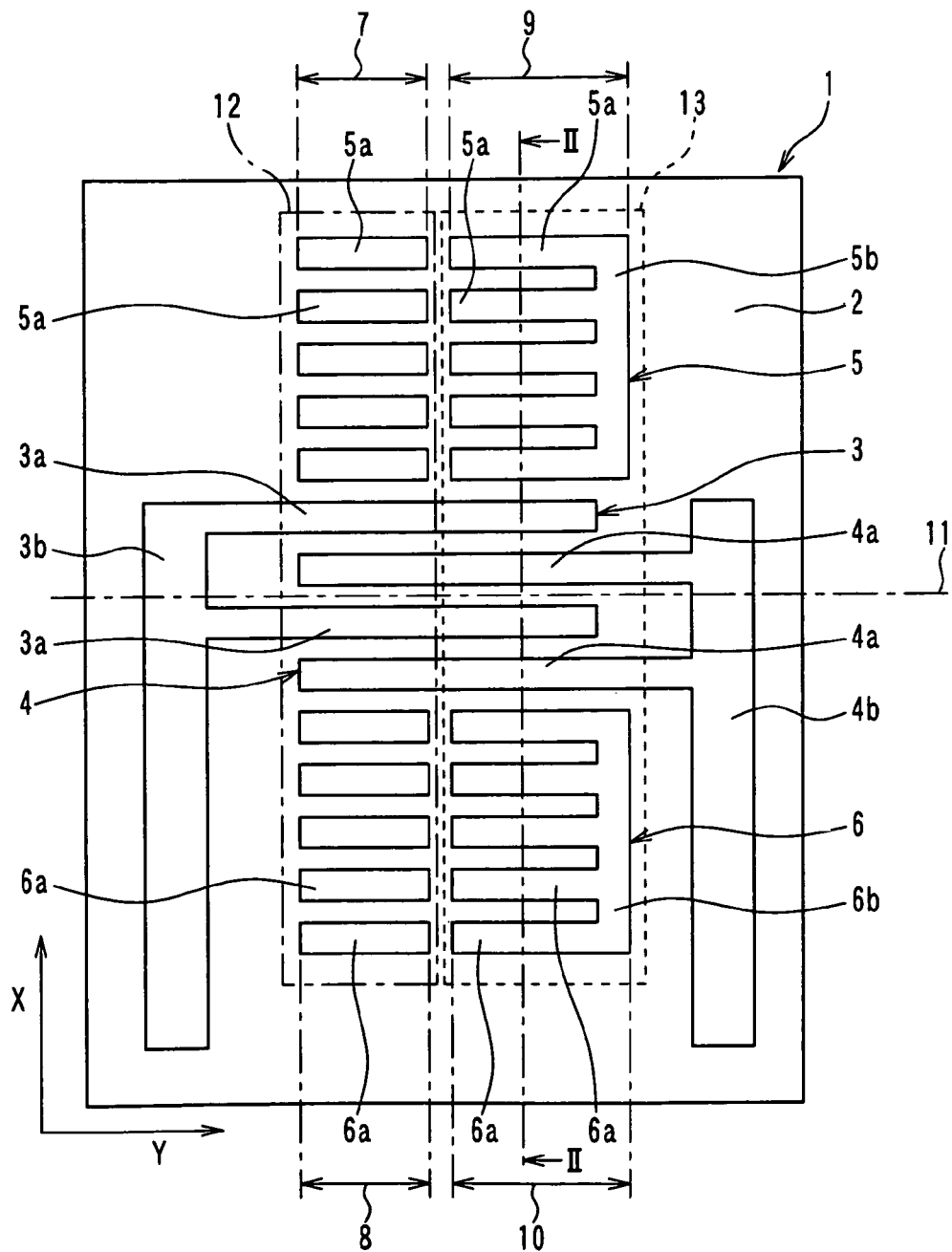
FIG. 1 is a plan view illustrating a surface acoustic wave element according to a first embodiment.
Figure 2:
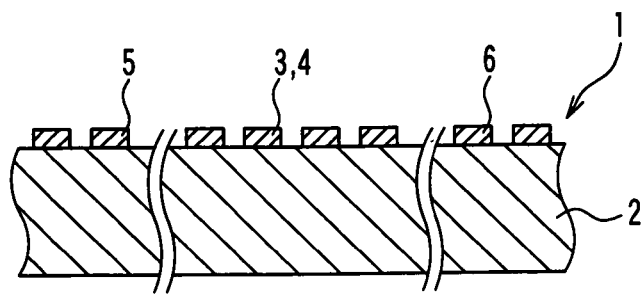
FIG. 2 is a schematic cross-sectional view taken along line II-II of FIG. 1.

As shown in FIGS. 1 and 2, a surface acoustic wave element 1 includes a piezoelectric substrate 2, a comb-teeth electrode 3, 4 and a reflector 5, 6. The piezoelectric substrate 2 is made of a single-crystal piezoelectric member. The comb-teeth electrode 3, 4 is an interdigital transducer (IDT), and is arranged on the piezoelectric substrate 2. The piezoelectric member may be lithium niobate or lithium tantalite, for example.

The comb-teeth electrode 3, 4 excites surface acoustic wave for the piezoelectric substrate 2. As shown in FIG. 1, the comb-teeth electrode 3, 4 has plural comb-teeth parts 3a, 4a extending parallel with each other in a Y-axis direction, and bus bars 3b, 4b connecting the comb-teeth parts 3a, 4a. The comb-teeth parts 3a, 4a are alternately arranged in the comb-teeth electrode 3, 4. Due to the comb-teeth electrode 3, 4, surface acoustic wave is transmitted in a direction approximately perpendicular to the longitudinal direction of the comb-teeth parts 3a, 4a. That is, surface acoustic wave is transmitted in an X-axis direction.

The reflector 5, 6 is arranged on both sides of the comb-teeth electrode 3, 4 in the wave transmitting direction, and reflects surface acoustic wave transmitted from the comb-teeth electrode 3, 4. The reflector 5, 6 has plural electrodes 5a, 6a arranged in the X-axis direction. The electrode 5a, 6a extends parallel with the comb-teeth part 3a, 4a, and the electrodes 5a, 6a are parallel with each other.

The reflector 5, 6 has an open area 7, 8 and a short area 9, 10. The electrodes 5a, 6a are not electrically shorted with each other in the open area 7, 8. The electrodes 5a, 6a are electrically shorted with each other in the short area 9, 10. The open area 7, 8 and the short area 9, 10 are arranged in a direction approximately perpendicular to the wave transmitting direction. That is, the open area 7, 8 and the short area 9, 10 are arranged in the Y-axis direction.

Ends of the electrodes 5a, 6a are connected by a connector 5b, 6b, in the short area 9, 10. Intervals between the electrodes 5a, 6a in the X-axis direction are the same in all of the areas 7, 8, 9, 10.

Longitudinal dimensions of the electrodes 5a, 6a\ are the same in the open area 7, 8, and longitudinal dimensions of the electrodes 5a, 6a are the same in the short area 9, 10.

As shown in FIG. 1, an axis 11 is defined to extend in a direction approximately perpendicular to the wave transmitting direction and to pass through an approximately center position among the comb-teeth parts 3a, 4a of the electrode 3, 4 in the wave transmitting direction. The reflector 5, 6 arranged on the both sides of the comb-teeth electrode 3, 4 has an electrode pattern symmetric with respect to the axis 11. That is, a ratio of the open area 7 to the short area 9 is the same as a ratio of the open area 8 to the short area 10.

In a case that the reflector 5, 6 has the open area 7, 8 and the short area 9, 10, a frequency to have the largest reflection efficiency is different between the open area 7, 8 and the short area 9, 10, even when the electrode interval is the same between the open area 7, 8 and the short area 9, 10.

The open area 7, 8 is arranged in the X-axis direction in an area 12 defined by a chain line of FIG. 1. The short area 9, 10 is arranged in the X-axis direction in an area 13 defined by a dash line of FIG. 1. Admittance characteristic of the surface acoustic wave element 1 is represented by a characteristic sum of the area 12 and the area 13. For example, when the admittance characteristic is measured by an impedance analyzer, a peak of a waveform of the element 1 is equal to a combination of peaks of waveforms of the areas 12, 13.

Therefore, a resonation frequency of the element 1 can be changed by changing the ratio of the open area 7, 8 to the short area 9, 10. For example, an open reflector is defined to have only an open area, and a short reflector is defined to have only a short area. In a case that the frequency is different between the open reflector and the short reflector by 2 MHz, when a half of the open area of the open reflector is changed into the short area, the frequency is varied by 1 MHz. In this case, a variation amount of the resonation frequency can be made smaller, compared with a case in which the electrode intervals of the reflector are uniformly changed. Thus, the resonation frequency can be set in more minute unit.

A method of producing the surface acoustic wave element 1 will be described.

The electrode interval of the comb-teeth electrode 3, 4 and the reflector 5, 6, and the ratio of the open area 7, 8 to the short area 9, 10 of the reflector 5, 6 are calculated in a manner that the resonation frequency of the element 1 has a target value.

Thus, the electrode pattern of the comb-teeth electrode 3, 4 and the reflector 5, 6 can be determined.

A membrane made of metal such as aluminum is formed on the piezoelectric substrate 2 by sputtering, for example. The comb-teeth electrode 3, 4 and the reflector 5, 6 are formed so as to have a predetermined electrode pattern by using a photo etching. Thus, the element 1 can be produced.

Second Embodiment

A method of producing a surface acoustic wave element 1 is changed in a second embodiment, compared with the first embodiment.

In the first embodiment, the ratio of the open area 7, 8 to the short area 9, 10 is calculated in advance so as to have the target resonation frequency. The reflector 5, 6 is formed by the photo etching so as to have the open area 7, 8 and the short area 9, 10 of FIG. 1.

Figure 3:
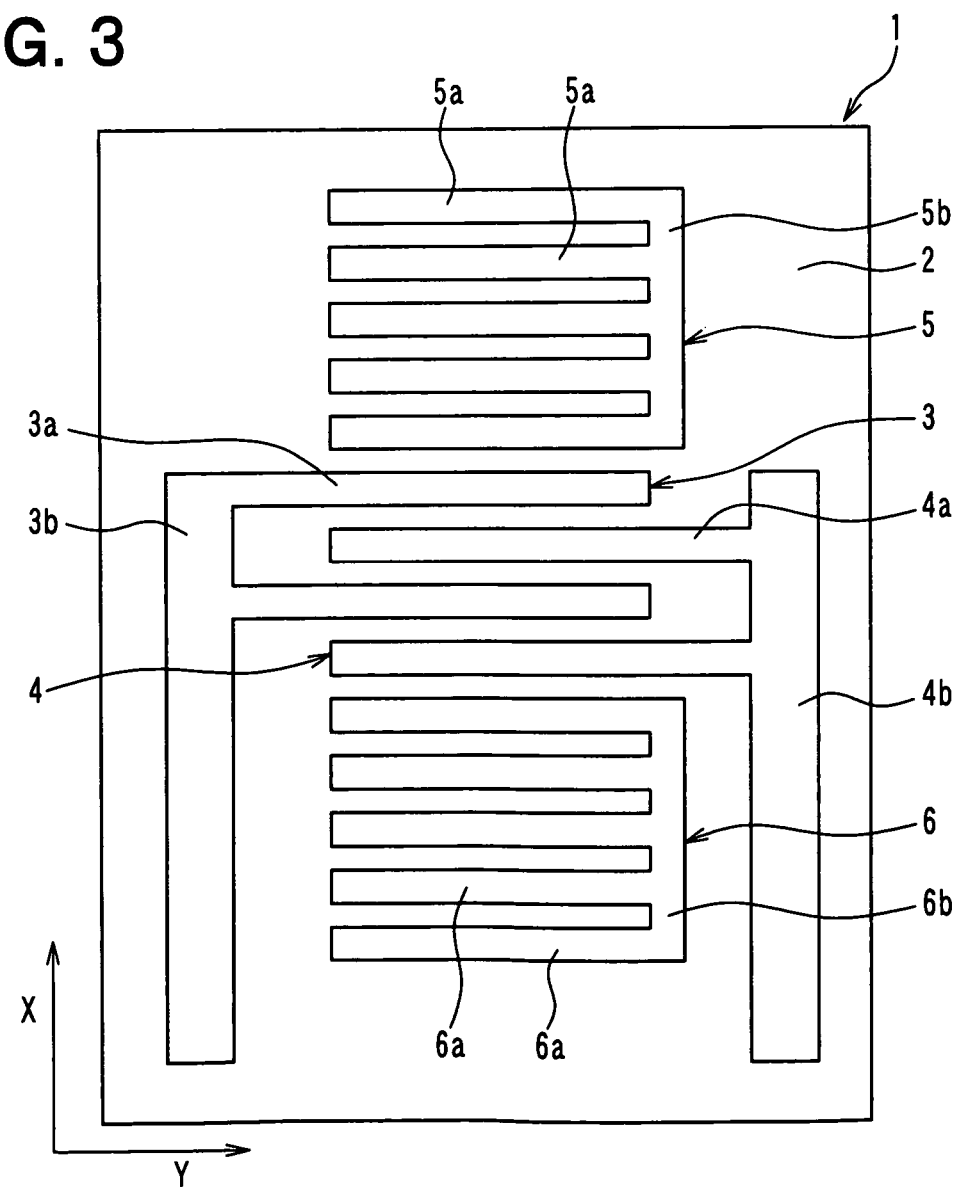
FIG. 3 is a plan view illustrating a method of producing a surface acoustic wave element according to a second embodiment.

In the second embodiment, a reflector 5, 6 is formed by a photo etching so as to have an electrode pattern shown in FIG. 3 on a piezoelectric substrate 2. At this time, ends of electrodes 5a, 6a of the reflector 5, 6 are connected by a connector 5b, 6b, and all of the electrodes 5a, 6a are electrically shorted with each other so as to have a shorted electrode pattern. That is, the reflector 5, 6 has a comb-teeth electrode pattern.

Figure 4:
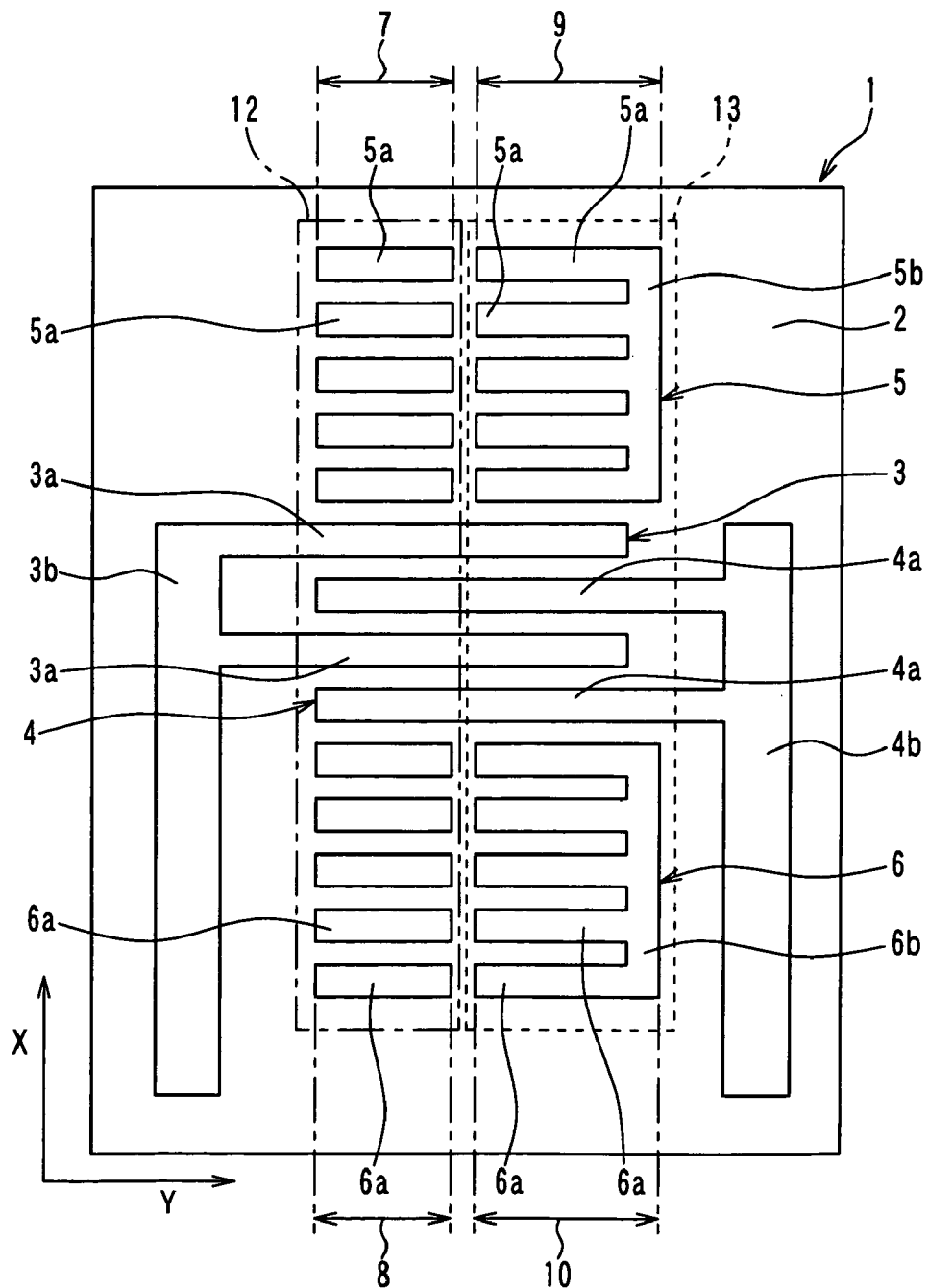
FIG. 4 is a plan view illustrating the producing method of the surface acoustic wave element according to the second embodiment.

As shown in FIG. 4, the electrodes 5a, 6a are cut to be separated from each other in the Y-axis direction by using laser, for example. At this time, admittance characteristic of the element 1 is measured by a measurement equipment connected to a comb-teeth electrode 3, 4. Thus, the reflector 5, 6 is formed to have an open area 7, 8 and a short area 9, 10. A relationship between a ratio of the open area 7, 8 to the short area 9, 10 and a variation amount of the resonation frequency is obtained in advance. The reflector 5, 6 is separated based on the relationship, so as to have the target resonation frequency.

Thus, a part of the reflector 5, 6 having the shorted electrode pattern is changed to be an opened electrode pattern. Therefore, the resonation frequency is made different between the shorted electrode pattern and the opened electrode pattern. Accordingly, the resonation frequency of the element 1 can be changed.

Figure 5:
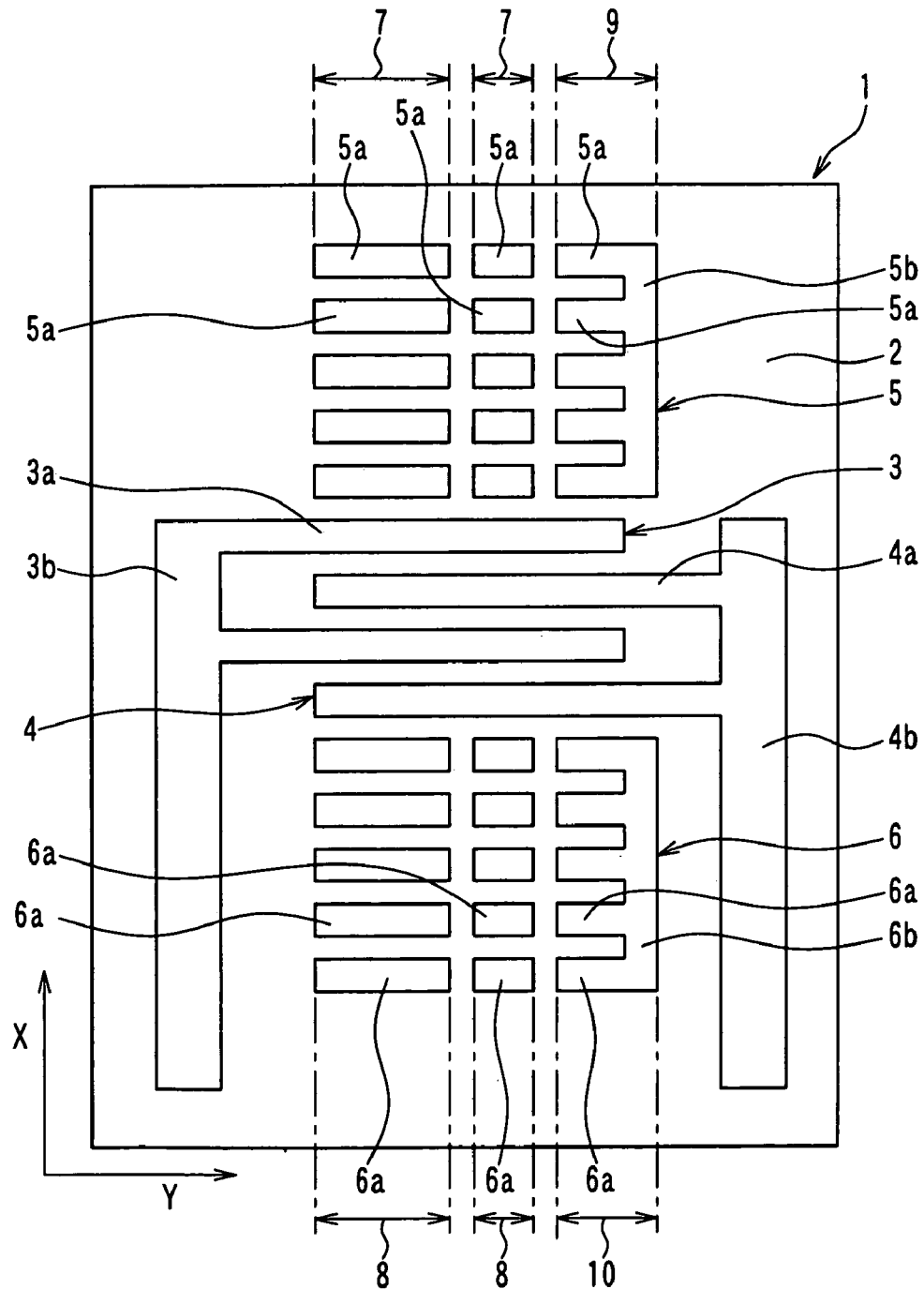
FIG. 5 is a plan view illustrating the producing method of the surface acoustic wave element according to the second embodiment.

As shown in FIG. 5, the shorted electrode pattern of the short area 9, 10 of FIG. 4 may be further cut to be separated from each other, if further adjustment of the resonation frequency is required. Thus, the short area 9, 10 is decreased, and the open area 7, 8 is increased. Accordingly, the resonation frequency can be further changed.

Third Embodiment

A reflector 5, 6 is changed in a third embodiment, compared with the first embodiment.

Figure 6:
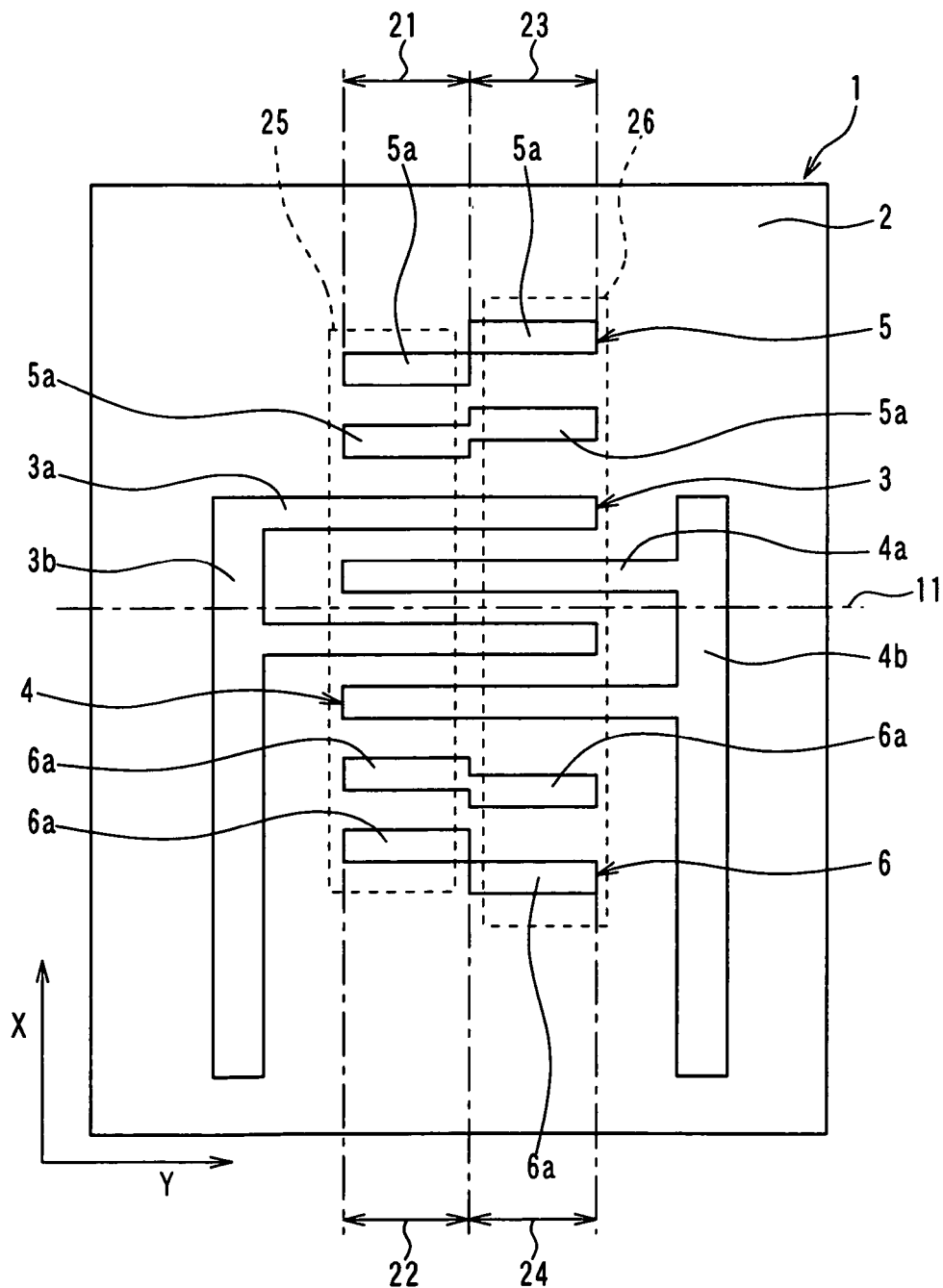
FIG. 6 is a plan view illustrating a surface acoustic wave element according to a third embodiment.

As shown in FIG. 6, a first part 5 of the reflector has two areas 21, 23, and an interval of electrodes 5a is different between the areas 21, 23. Further, a second part 6 of the reflector has two areas 22, 24, and an interval of electrodes 6a is different between the areas 22, 24.

A Y-axis direction length of the electrode 5a, 6a, and an X-axis direction interval between the electrodes 5a, 6a are the same in the areas 21, 22 located on a left side of FIG. 6.

A longitudinal length of the electrode 5a, 6a, and an X-axis direction interval between the electrodes 5a, 6a are the same in the areas 23, 24 located on a right side of FIG. 6. The interval of the electrodes 5a, 6a in the area 23, 24 is larger than that in the area 21, 22.

Therefore, the reflector 5, 6 has an electrode pattern symmetric with respect to an axis 11 of FIG. 6, similarly to the first embodiment. The axis 11 is defined to extend in a direction approximately perpendicular to the wave transmitting direction and to pass through an approximately center position among the comb-teeth parts 3a, 4a of the electrode 3, 4 in the wave transmitting direction.

The electrodes 5a, 6a located adjacent to each other in the Y-axis direction are connected in the third embodiment. Alternatively, the electrodes 5a, 6a located adjacent to each other in the Y-axis direction may be separated from each other.

According to the third embodiment, the reflector 5, 6 has the area 21, 22 having the smaller electrode interval and the area 23, 24 having the larger electrode interval. Accordingly, the reflector 5, 6 has plural areas, and the frequency to have the largest reflection efficiency is different between the plural areas.

The areas 21, 22 are located in an area 25 defined by a dash line of FIG. 6, and the areas 23, 24 are located in an area 26' defined by another dash line of FIG. 6. Admittance characteristic of the element 1 is represented by a characteristic sum of the area 25 and the area 26.

Therefore, the resonation frequency of the element 1 can be changed by changing the ratio of the area 21, 22 to the area 23, 24. The electrode interval in the area 23, 24 is larger than that in the area 21, 22.

For example, when all electrode intervals are changed by 0.1 μm in a reflector having uniform electrode intervals, the resonation frequency is changed by 2 MHz. In this case, when half of the electrode intervals are changed, the resonation frequency is changed by 1 MHz. Thus, a variation amount of the resonation frequency can be made smaller, compared with a case in which the whole of the electrode intervals of the reflector are uniformly changed. Accordingly, the resonation frequency can be set in more minute unit.

The surface acoustic wave element 1 of FIG. 6 can be produced similarly to the first embodiment. The electrode intervals of the electrodes 5a, 6a and the ratio of the area 21, 22 to the area 23, 24 are calculated in advance. The reflector 5, 6 is formed to have an electrode pattern defined based on the calculation by using a photo etching.

Fourth Embodiment

A reflector 5, 6 is changed in a fourth embodiment, compared with the third embodiment.

Figure 7:
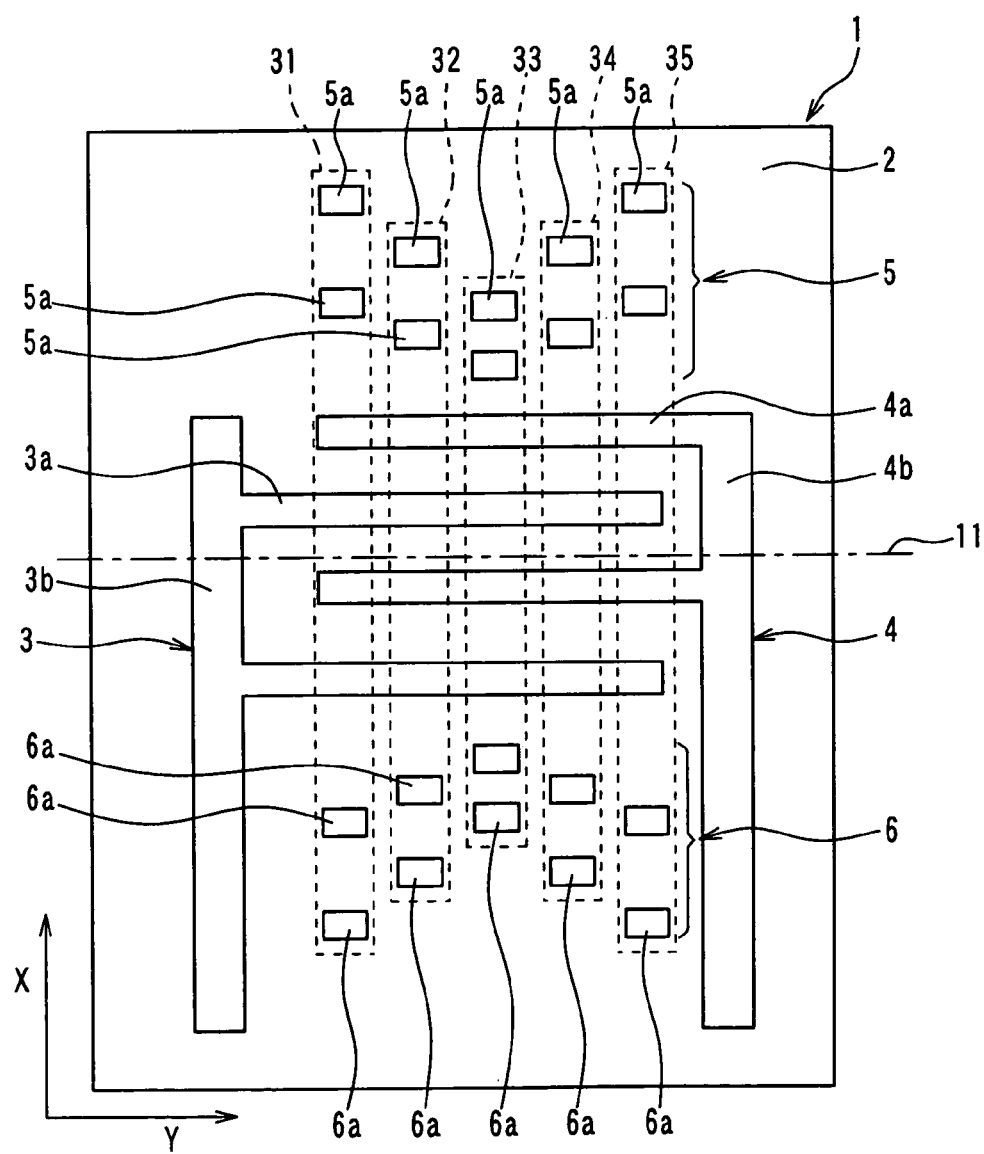
FIG. 7 is a plan view illustrating a surface acoustic wave element according to a fourth embodiment.

As shown in FIG. 7, the reflector 5, 6 is separated into plural areas 31, 32, 33, 34, 35 arranged in the Y-axis direction, and the number of the plural areas is larger than that in the third embodiment. That, is, the electrodes 5a, 6a of the reflector 5, 6 are separated into five parts, for example, in the Y-axis direction. The interval of the electrodes 5a, 6a in the X-axis direction is different among the areas 31, 32, 33, 34, 35 defined by dash lines of FIG. 7.

A Y-axis direction length of the electrode 5a, 6a, and an X-axis direction interval of the electrodes 5a, 6a are the same in a single area. Further, the separated electrodes 5a, 6a are arranged to be distanced from each other in the Y-axis direction. Therefore, the reflector 5, 6 has an electrode pattern symmetric with respect to an axis 11 of FIG. 7, similarly to the first embodiment. The axis 11 is defined to extend in a direction approximately perpendicular to the wave transmitting direction and to pass through an approximately center position among the comb-teeth parts 3a, 4a of the electrode 3, 4 in the wave transmitting direction.

Admittance characteristic of the element 1 is represented by a characteristic sum of the areas 31, 32, 33, 34, 35 defined by the dash lines of FIG. 7. The electrodes 5a, 6a are arranged in the X-axis direction with the same interval in each of the areas 31, 32, 33, 34, 35.

According to the fourth embodiment, the reflector 5, 6 has plural areas, and the interval of the electrodes 5a, 6a in the X-axis direction is different among the plural areas. The resonation frequency can be set in more minute unit by setting the ratio of the areas.

Fifth Embodiment

A surface acoustic wave element 1 of a fifth embodiment will be described with reference FIGS. 8 and 9.

Figure 8:
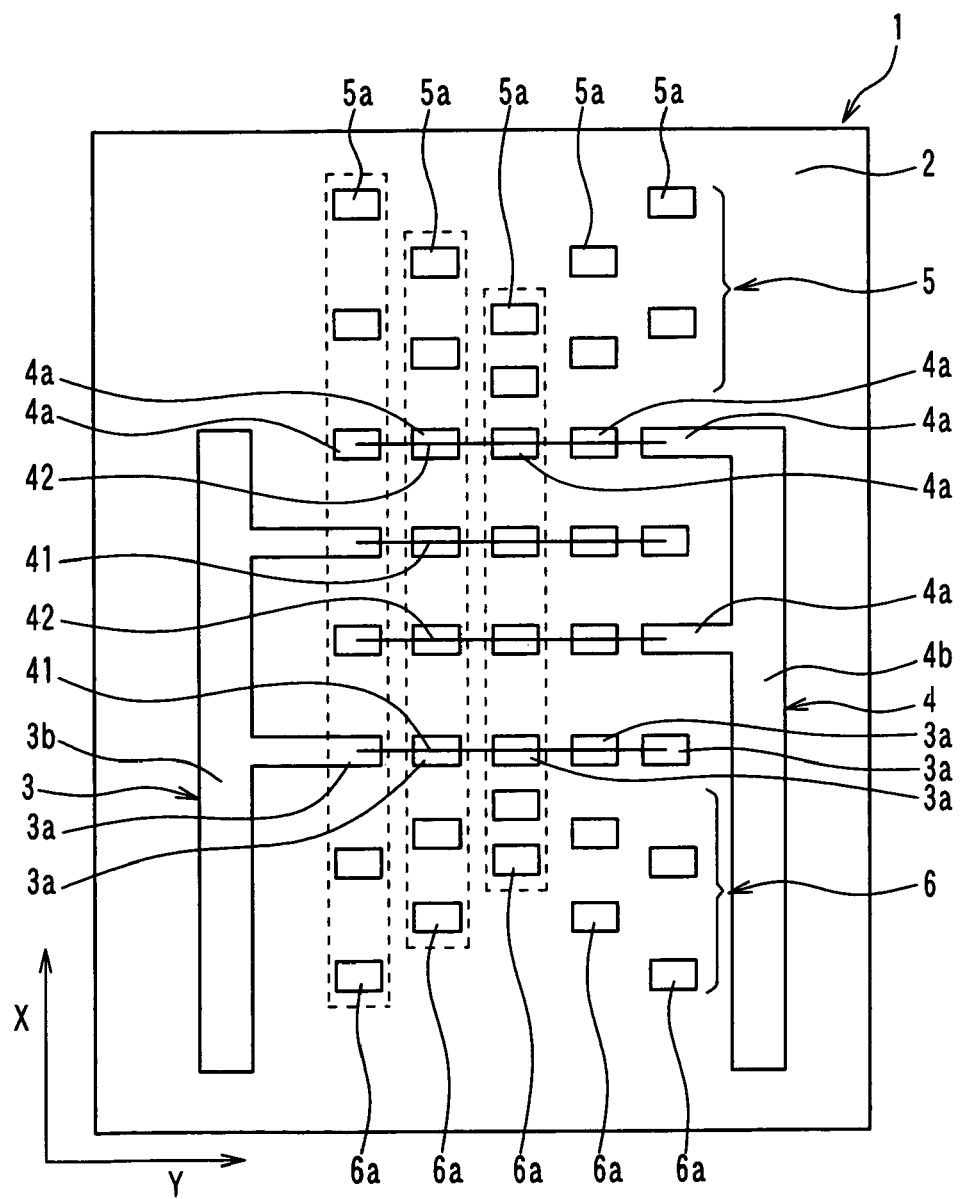
FIG. 8 is a plan view illustrating a surface acoustic wave element according to a fifth embodiment.

As shown in FIG. 8, the reflector 5, 6 is separated into plural areas in the Y-axis direction, similarly to the fourth embodiment. For example, the reflector 5, 6 is separated into five areas, and the interval of the electrodes 5a, 6a in the X-axis direction is different among the five areas.

Further, the comb-teeth parts 3a, 4a of the comb-teeth electrode 3, 4 are separated into five parts in the Y-axis direction so as to correspond to the five areas of the reflector 5, 6. All of the intervals of the comb-teeth parts 3a, 4a in the X-axis direction are the same among the five areas.

The separated electrodes 3a, 4a adjacent to each other in the Y-axis direction are connected with each other by a wiring 41, 42. The wiring 41, 42 is a metal wire used for connecting IC chips, for example. Thus, the separated electrodes 3a, 4a arranged in the Y-axis direction are electrically connected with each other.

Figure 9:
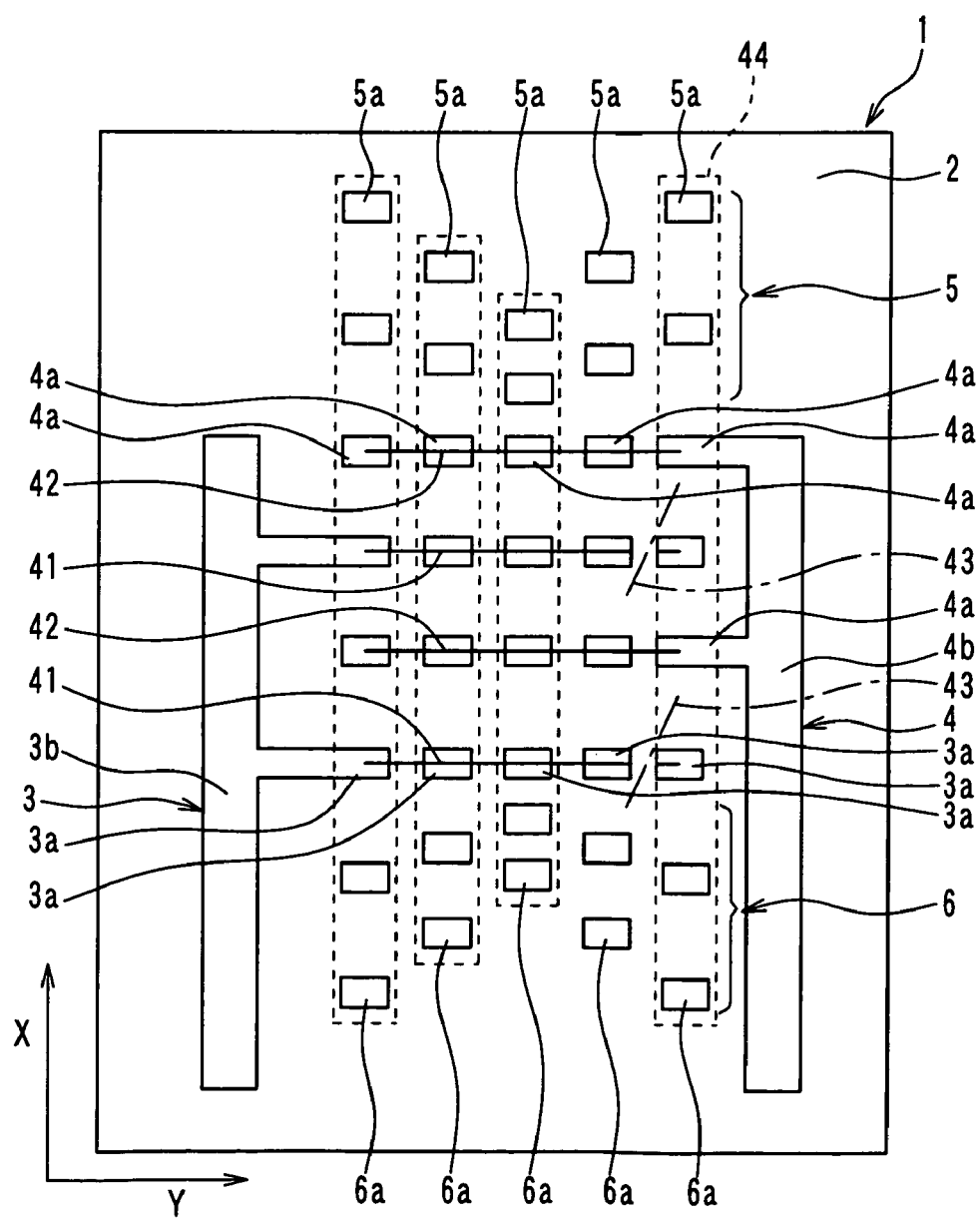
FIG. 9 is a plan view illustrating the surface acoustic wave element of the fifth embodiment.

As shown in a chain line 43 of FIG. 9, a part of the wiring 41 is cut, such that the most-ended separated electrode 3a opposing to a bus bar 4b, for example, is electrically isolated. Therefore, admittance characteristic of an area 44 becomes small, when the area 44 is defined by this separated-electrode 3a and the electrodes 5a, 6a arranged in the X-axis direction. Because influence of the area 44 becomes small relative to the element 1, the resonation frequency is changed as a whole.

The wiring 41 is cut by a pin, for example, so as to control the resonation frequency of the surface acoustic wave element 1. At this time, the admittance characteristic of the element 1 is measured by a measurement equipment connected to the comb-teeth electrode 3, 4. The resonation frequency can be controlled to have a target value by controlling the electrically-connected length of the comb-teeth part 3a.

In a case that the wiring 41 is cut, a peak value of the measured admittance characteristic may be decreased.

When two resonators are used to obtain a difference of frequencies, the peak value is required to be the same between the two resonators. Therefore, a surface acoustic wave element used for a reference may have an approximately the same construction as the surface acoustic wave element 1 of FIG. 8.

Figure 10:
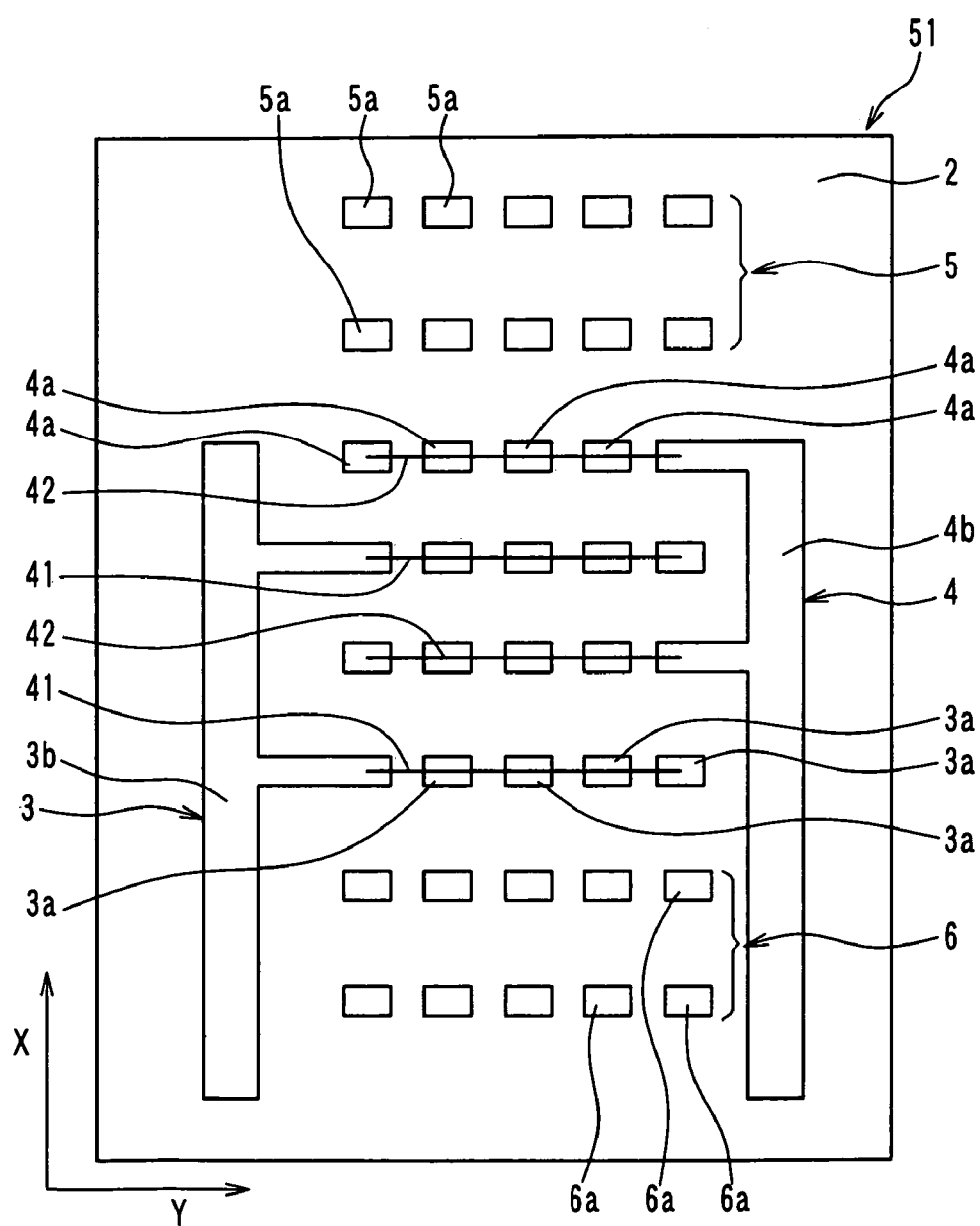
FIG. 10 is a plan view illustrating a reference element of the fifth embodiment.

FIG. 10 shows a plan view illustrating a reference element 51 used for the surface acoustic wave element 1. The reference element 51 has a comb-teeth electrode 3, 4 and a reflector 5, 6, which are constructed by an electrode pattern having plural areas separated in the Y-axis direction. An interval of electrodes 5a, 6a of the reflector 5, 6 in the X-axis direction is the same among all the areas.

Electrodes 3a, 4a of the comb-teeth electrode 3, 4 located adjacent to each other in the Y-axis direction are connected by a wiring 41, 42. The peak value may be controlled by cutting the wiring 41, 42.

Sixth Embodiment

Figure 11:
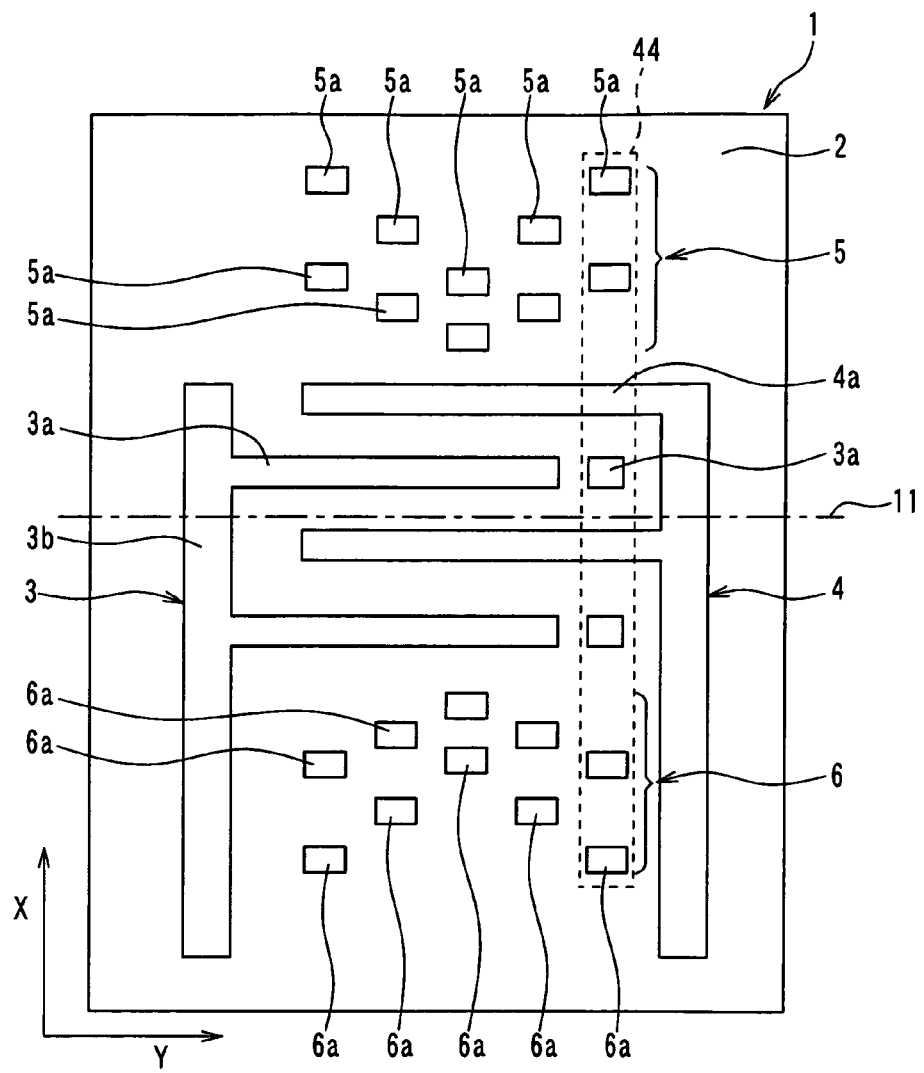
FIG. 11 is a plan view illustrating a surface acoustic wave element according to a sixth embodiment.

FIG. 11 shows a plan view illustrating a surface acoustic wave element according to a six embodiment. A construction of the element 1 corresponds to that of the fourth embodiment of FIG. 7. That is, comb-teeth parts 3a, 4a of a comb-teeth electrode 3, 4 are formed to have a non-separated electrode pattern extending in the Y-axis. Thus, electric conduction of the comb-teeth part 3a, 4a is maintained.

As shown in FIG. 11, a part of the comb-teeth part 3a is cut by using laser so as to correspond to one of the five areas of the reflector 5, 6 arranged in the Y-axis direction. Thus, electrically-conducted length of the comb-teeth part 3a is made short so as to control the resonation frequency of the element 1. Electrically-isolated electrode 3a is formed by cutting the comb-teeth electrode 3, and is located to correspond to a right end area of the reflector 5, 6 of FIG. 11, for example.

Therefore, similarly to the fifth embodiment, admittance characteristic of an area 44 of FIG. 11 becomes small, and the area 44 is constructed by the electrically-isolated electrode 3a and the electrodes 5a, 6a arranged in the X-axis direction. Thus, an influence of the area 44 becomes small relative to the element 1. Accordingly, the resonation frequency of the element 1 can be controlled to have a required value.

Other Embodiments

The piezoelectric substrate 2 is made of the single-crystal piezoelectric member in FIG. 2. Alternatively, as shown in FIG. 12, the piezoelectric substrate 2 may be made of other member including a piezoelectric membrane.

Figure 12:
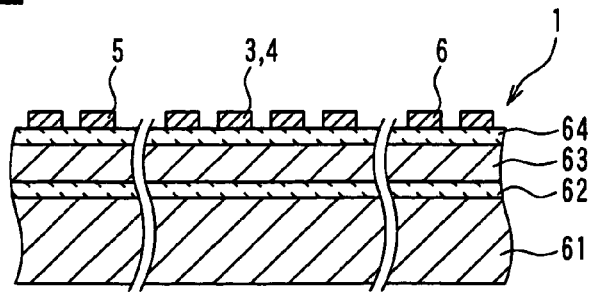
FIG. 12 is a schematic cross-sectional view illustrating a surface acoustic wave element according to other embodiments.

For example, a surface acoustic wave element 1 of FIG. 12 includes a lower oxide film 62, a piezoelectric membrane 63 and an upper oxide film 64, which are layered on a substrate 61 in this order. Electrodes 3, 4, 5, 6 are formed on the upper oxide film 64.

In the first embodiment, the interval of the electrodes 5a, 6a in the X-axis direction is the same between the open area 7, 8 and the short area 9, 10. Alternatively, the interval of the electrodes 5a, 6a in the X-axis direction may be different between the open area 7, 8 and the short area 9, 10. In this case, the interval of the electrodes 5a, 6a is the same in each of the areas 7, 8, 9, 10.

In the second embodiment, the electrodes 5a, 6a are cut in the short area 9, 10. Thus, the short area 9, 10 is decreased, and the open area 7, 8 is increased. Alternatively, the ratio of the open area 7, 8 to the short area 9, 10 may be changed by increasing the short area 9, 10 and decreasing the open area 7, 8.

For example, the ratio of the open area 7, 8 to the short area 9, 10 may be changed by connecting the electrodes 5a, 6a between the short area 9, 10 and the open area 7, 8 arranged adjacent to each other.

In this case, the metal membrane is formed again, and an patterning is performed by the photo etching. Alternatively, the electrodes 5a, 6a may be connected by using focused ion beam (FIB) or wire bonding.

In the third embodiment, the interval of the electrodes 5a, 6a in the X-axis direction is different between the two areas 25, 26. In the fourth embodiment, the interval of the electrodes 5a, 6a in the X-axis direction is different among the five areas 31, 32, 33, 34, 35. The number of the areas is changeable, and is not limited to two or five.

Further, in the fourth embodiment, the interval of the electrodes 5a, 6a in the X-axis direction is the same between the two areas 31, 35, and between the two areas 32, 34. Thus, the interval is different between at least two of the areas. Alternatively, the interval may be different among all of the areas.

When the reflector 5, 6 has three or more areas, a frequency to have, the largest reflection efficiency is different between at least two of the areas.

The reflector 5, 6 is arranged on both sides of the comb-teeth electrode 3, 4 in the wave transmitting direction. Alternatively, the reflector 5, 6 may be arranged on a single side of the comb-teeth electrode 3, 4.

The embodiments may be combined with each other in a practicable range. Such changes and modifications are to be understood as being within the scope of the present invention as defined by the appended claims.

What is claimed is:

1. A surface acoustic wave element comprising:
a piezoelectric member;
a comb-teeth electrode arranged on the piezoelectric member; and
a reflector arranged on the piezoelectric member so as to reflect a surface acoustic wave transmitted from the comb-teeth electrode, wherein
the reflector has a plurality of areas, each of the areas having a frequency to have a largest reflection efficiency, and the frequencies are different from each other,
the plurality of areas are arranged in a direction perpendicular to a wave transmitting direction of the surface acoustic wave in a section where the surface acoustic wave transmitted from the comb-teeth electrode is reflected,
the reflector has a plurality of electrodes arranged in the wave transmitting direction,
the electrodes have the same interval in the wave transmitting direction, and
the interval of the electrodes is different between the plurality of areas.

2. The surface acoustic wave element according to claim 1, wherein
the reflector is arranged on both sides of the comb-teeth electrode in the wave transmitting direction,
the reflector has an electrode pattern symmetric with respect to an axis, and
the axis is defined to extend perpendicular to the wave transmitting direction, and to pass through a center position of the comb-teeth electrode.

3. A surface acoustic wave element comprising:
a piezoelectric member;
a comb-teeth electrode arranged on the piezoelectric member; and
a reflector arranged on the piezoelectric member so as to reflect a surface acoustic wave transmitted from the comb-teeth electrode, wherein
the reflector has a plurality of areas, each of the areas having a frequency to have a largest reflection efficiency, and the frequencies are different from each other,
the plurality of areas are arranged in a direction perpendicular to a wave transmitting direction of the surface acoustic wave in a section where the surface acoustic wave transmitted from the comb-teeth electrode is reflected,
the reflector has a plurality of electrodes arranged in the wave transmitting direction,
the plurality of areas of the reflector has:
an open area in which the electrodes are not shorted with each other and
a short area in which the electrodes are shorted with each other,
the reflector is arranged on both sides of the comb-teeth electrode in the wave transmitting direction,
the reflector has an electrode pattern symmetric with respect to an axis, and
the axis is defined to extend approximately perpendicular to the wave transmitting direction, and to pass through an approximately center position of the comb-teeth electrode.

4. A method of producing a surface acoustic wave element, the surface acoustic wave element comprising:
a piezoelectric member;
a comb-teeth electrode arranged on the piezoelectric member; and
a reflector arranged on the piezoelectric member so as to reflect a surface acoustic wave transmitted from the comb-teeth electrode, wherein
the reflector has a plurality of areas, each of the areas having a frequency to have a largest reflection efficiency, and the frequencies are different from each other,
the plurality of areas are arranged in a direction perpendicular to a wave transmitting direction of the surface acoustic wave in a section where the surface acoustic wave transmitted from the comb-teeth electrode is reflected,
the reflector has a plurality of electrodes arranged in the wave transmitting direction,
the plurality of areas of the reflector has:
an open area in which the electrodes are not shorted with each other and
a short area in which the electrodes are shorted with each other,
the reflector is arranged on both sides of the comb-teeth electrode in the wave transmitting direction,
the reflector has an electrode pattern symmetric with respect to an axis, and
the axis is defined to extend approximately perpendicular to the wave transmitting direction, and to pass through an approximately center position of the comb-teeth electrode,
the producing method comprising:
forming the comb-teeth electrode on the piezoelectric member;
forming the reflector on the piezoelectric member, such that all of the electrodes of the reflector are connected with each other by a connector; and
cutting the electrodes of the reflector so as to separate the reflector into the open area and the short area.

5. The producing method according to claim 4, further comprising
controlling a resonation frequency of the surface acoustic wave element by further cutting the electrodes of the reflector in the short area, such that the short area is decreased and that the open area is increased.

* * * * *